(12) United States Patent
Chou et al.

(10) Patent No.: US 10,928,674 B1
(45) Date of Patent: Feb. 23, 2021

(54) LIGHT SOURCE MODULE OF DISPLAY DEVICE AND MANUFACTURING METHOD THEREOF

(71) Applicants: Interface Technology (ChengDu) Co., Ltd., Sichuan (CN); Interface Optoelectronics (ShenZhen) Co., Ltd., Guangdong (CN); General Interface Solution Limited, Miaoli County (TW)

(72) Inventors: Hsien-Ying Chou, Miaoli County (TW); Po-Lun Chen, Miaoli County (TW); Nai-Hau Shiue, Miaoli County (TW); Chun-Ta Chen, Miaoli County (TW); Ta-Jen Huang, Miaoli County (TW); Yi-Lin Sun, Miaoli County (TW)

(73) Assignees: INTERFACE TECHNOLOGY (CHENGDU) CO., LTD., Chengdu (CN); INTERFACE OPTOELECTRONICS (SHENZHEN) CO., LTD., Shenzhen (CN); GENERAL INTERACE SOLUTION LIMITED, Miaoli County (TW)

( * ) Notice: Subject to any disclaimer, the term of this patent is extended or adjusted under 35 U.S.C. 154(b) by 0 days.

(21) Appl. No.: 16/819,253

(22) Filed: Mar. 16, 2020

(30) Foreign Application Priority Data

Jan. 19, 2020 (CN) .......................... 202010058537.9

(51) Int. Cl.
*G02F 1/13357* (2006.01)
*H01L 25/075* (2006.01)
(Continued)

(52) U.S. Cl.
CPC .. *G02F 1/133606* (2013.01); *G02F 1/133603* (2013.01); *H01L 25/0753* (2013.01);
(Continued)

(58) Field of Classification Search
CPC ......... G02F 1/133603; G02F 1/133606; G02F 2001/133607; H01L 33/52; H01L 33/54;
(Continued)

(56) References Cited

U.S. PATENT DOCUMENTS 7,951,621 B2 * 5/2011 Wang ................ G02F 1/133603
438/26
2007/0002566 A1 * 1/2007 Wu .................... G02F 1/133603
362/245
(Continued)

*Primary Examiner* — Alan B Cariaso
(74) *Attorney, Agent, or Firm* — Locke Lord LLP; Tim Tingkang Xia, Esq.

(57) ABSTRACT

A manufacturing method using a micro-miniature LED as a light source for backlight thickness reduction and light efficiency improvement comprising a plurality of spaced apart light emitting diode chips on a substrate. Colloid with uniformly distributed diffusion particles is coated to fill gaps between LED chips. A roller is applied to the surface of the colloid and a continuous geometric structure is formed with a cone structure in the horizontal-vertical (XY axis) direction. An ultraviolet curing device is used for optical UV curing of the continuous geometric structure to create a brightness enhancement layer.

15 Claims, 15 Drawing Sheets

(51) Int. Cl.
  *H01L 33/56* (2010.01)
  *H01L 33/54* (2010.01)

(52) U.S. Cl.
  CPC .............. *H01L 33/54* (2013.01); *H01L 33/56* (2013.01); *H01L 2933/005* (2013.01); *H01L 2933/0091* (2013.01)

(58) Field of Classification Search
  CPC ................. H01L 33/56; H01L 25/0753; H01L 2933/005; H01L 2933/0091
  See application file for complete search history.

(56) References Cited

U.S. PATENT DOCUMENTS

| | | | | |
|---|---|---|---|---|
| 2008/0064131 | A1* | 3/2008 | Chang | G02F 1/133603 438/29 |
| 2011/0242796 | A1* | 10/2011 | Yang | C09J 133/08 362/97.1 |
| 2013/0107574 | A1* | 5/2013 | Baek | G02F 1/133603 362/612 |
| 2019/0025650 | A1* | 1/2019 | Chen | G02F 1/133603 |
| 2020/0227600 | A1* | 7/2020 | Watanabe | H01L 33/54 |
| 2020/0249530 | A1* | 8/2020 | He | G02F 1/133606 |

\* cited by examiner

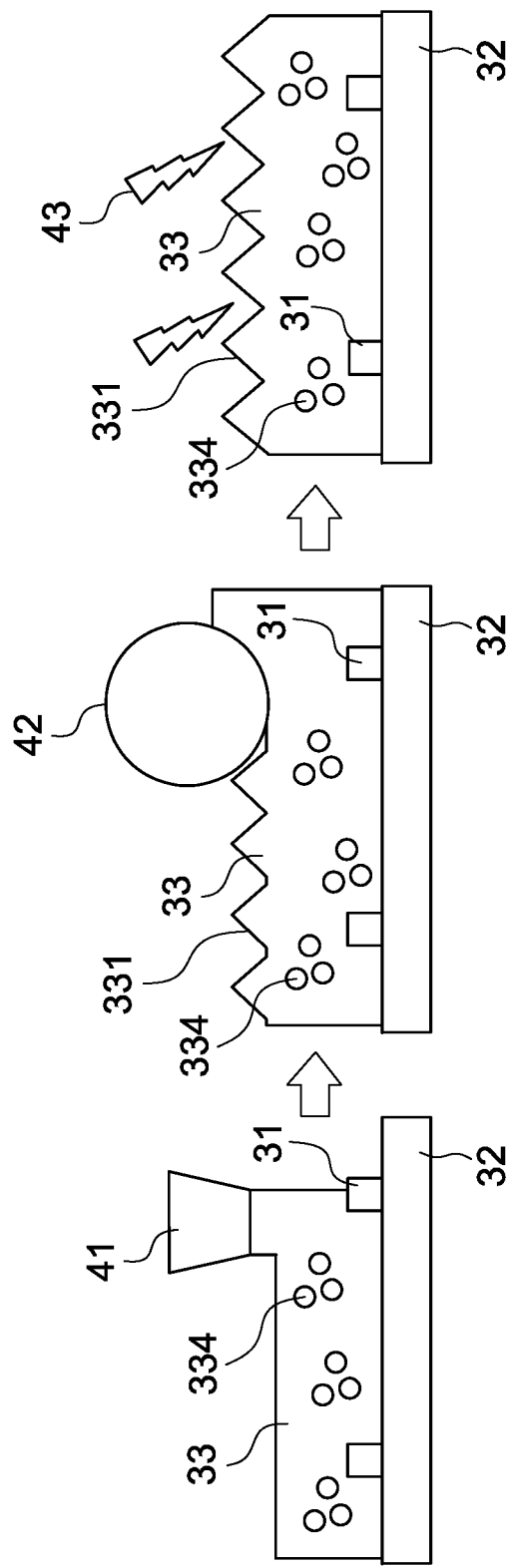

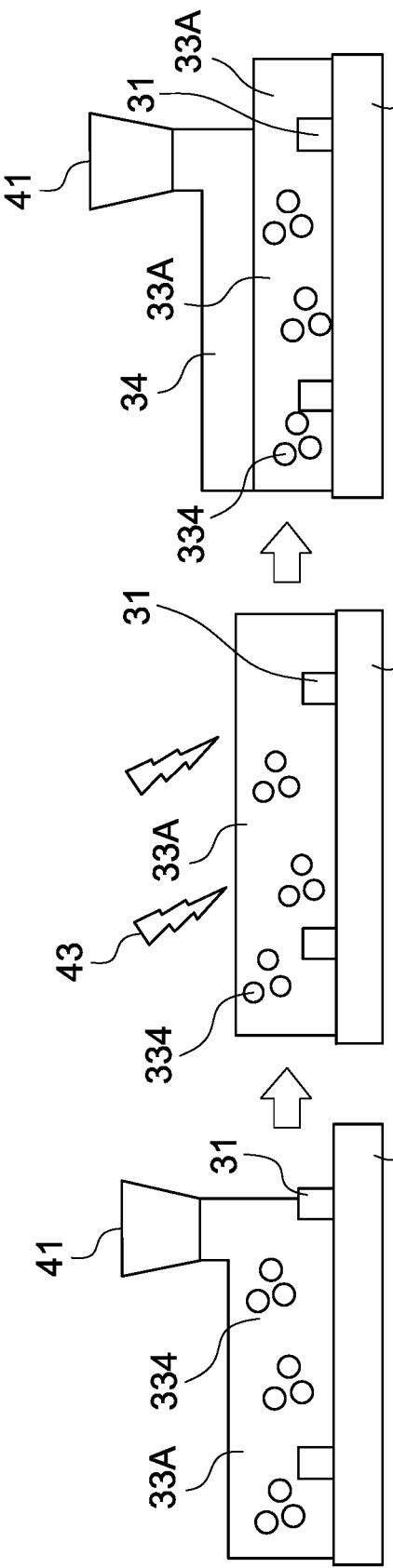
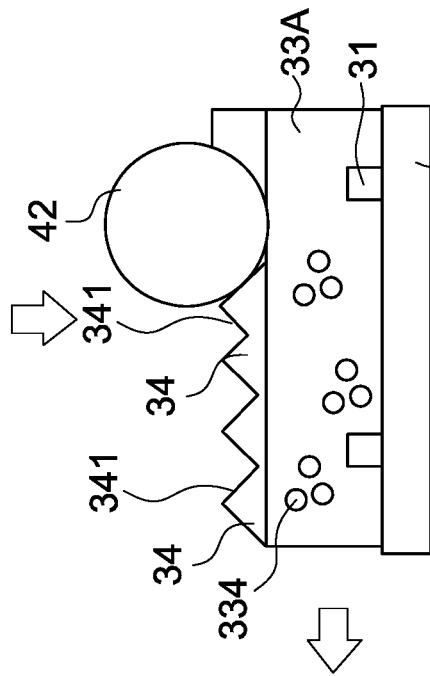
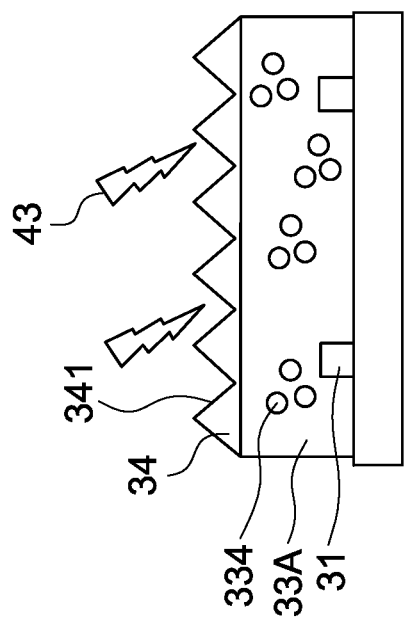
Fig. 3A
Fig. 3B
Fig. 3C
Fig. 3D
Fig. 3E

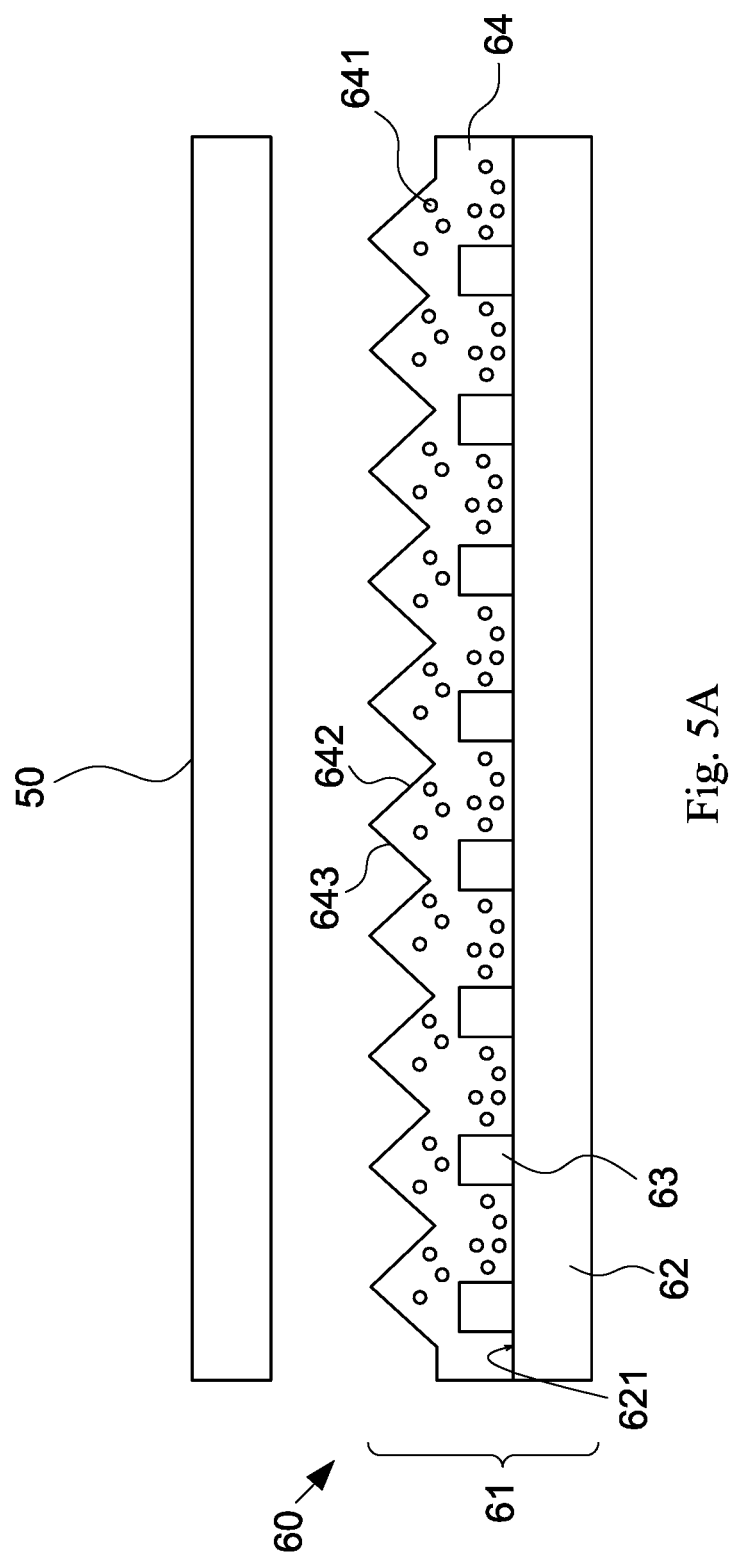

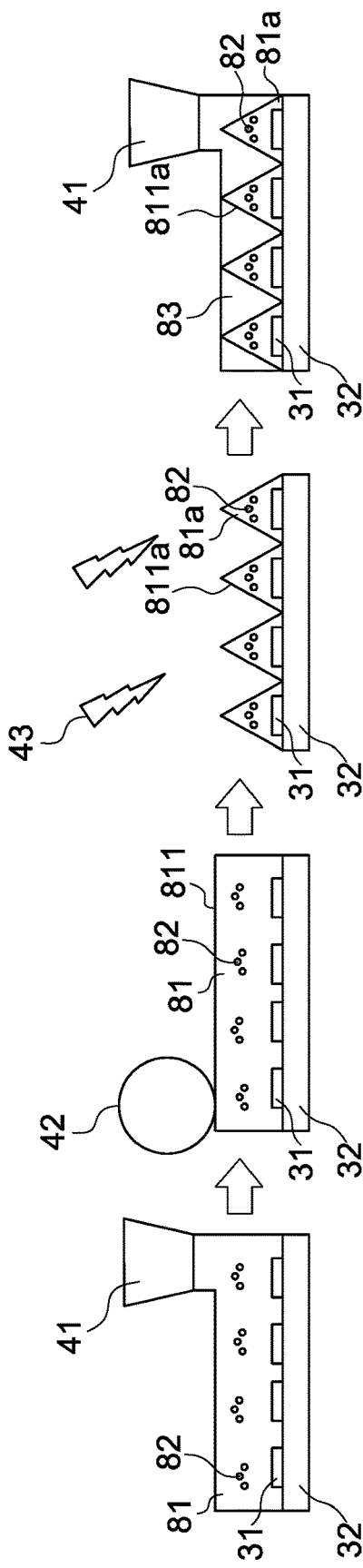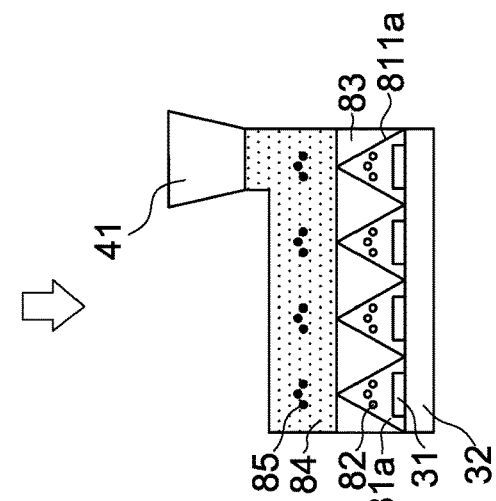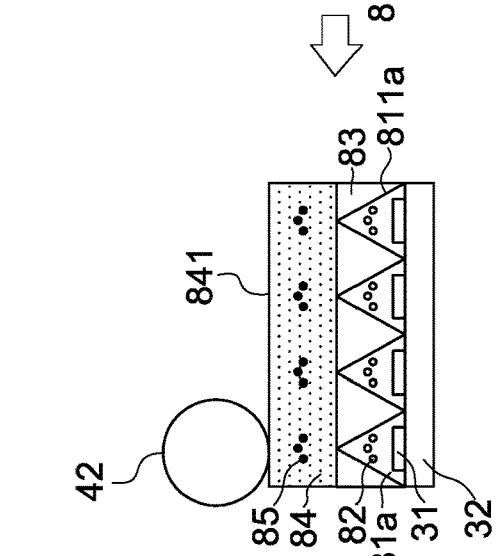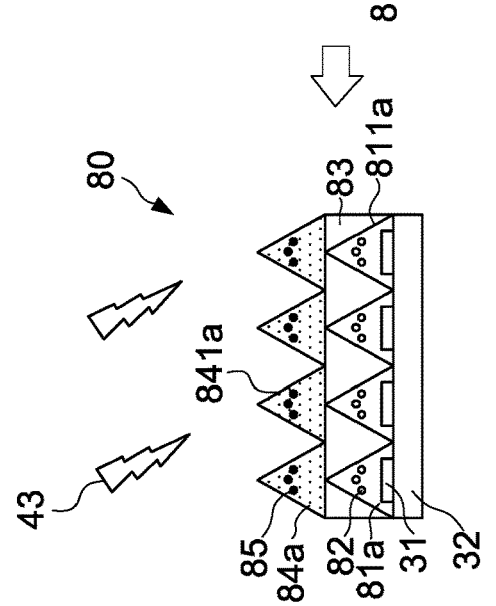

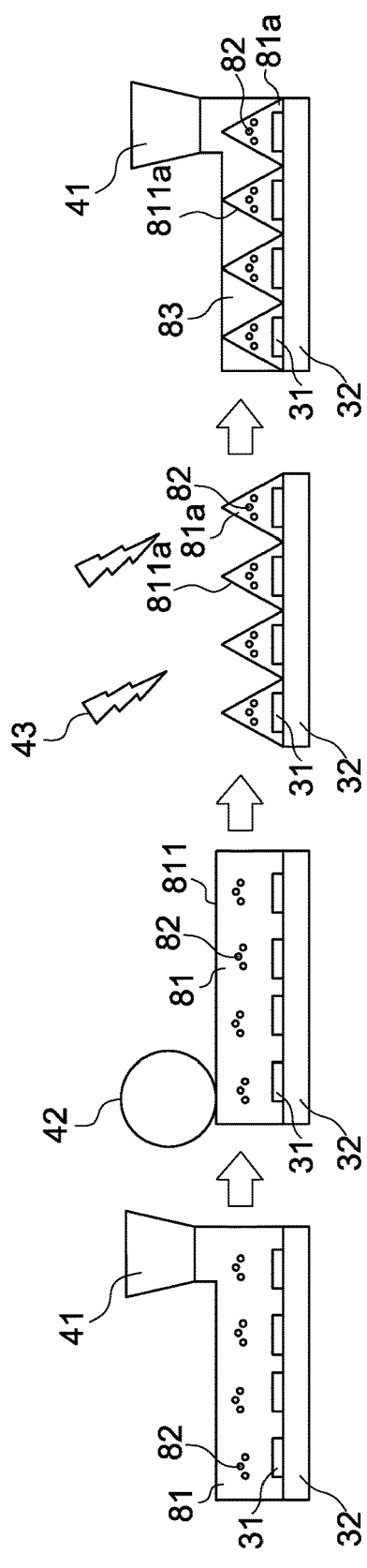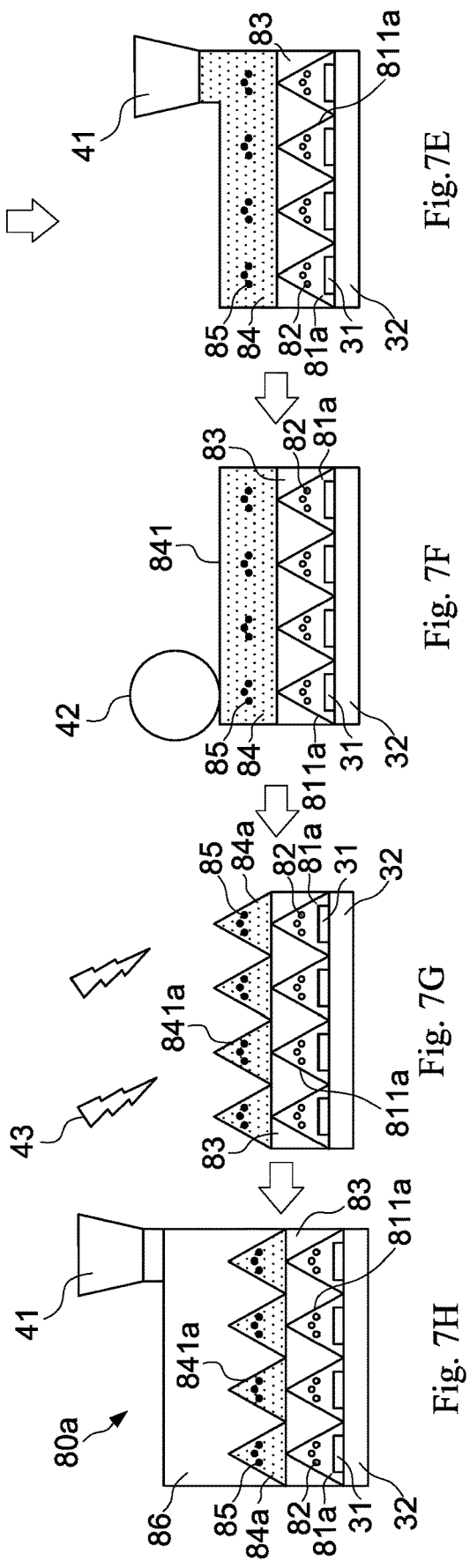

LIGHT SOURCE MODULE OF DISPLAY DEVICE AND MANUFACTURING METHOD THEREOF

CROSS-REFERENCE TO RELATED APPLICATIONS

This non-provisional application claims priority under 35 U.S.C. § 119(a) on Patent Application No(s). 202010058537.9 filed in China on Jan. 19, 2020, the entire contents of which are hereby incorporated by reference.

BACKGROUND OF THE INVENTION

Field of the Invention

The present invention relates to a light source module of a display device and a manufacturing method thereof, and more particularly to a micro-miniature light emitting diode (LED) manufacturing method that greatly reduces the thickness and greatly improves the transmittance of the interface reflection efficiency.

Description of the Prior Art

In recent years, miniaturized photovoltaic devices have been vigorously developed, Miniature LEDs with LED sizes reduced to less than 200 microns have been widely used in display devices. A display device using a micro-miniature LED has the advantages of high brightness, high contrast, fast response, and low power consumption. Refer to FIGS. 1A and 1B, which show a display device 10 of the prior art. The display device 10 includes a liquid crystal panel 17.

A backlight module 11 is provided, wherein the backlight module 11 includes a plurality of first brightness enhancement films 15, a plurality of second brightness enhancement films 16 (other films are not shown), a diffusion sheet 14, and a light source module 12. The light source module 12 uses a micro-miniature LED 123 that has a light-emitting area 13. In order to make the light emitted from the light-emitting area 13 uniform, the diffusion sheet 14 provides a (Lambertian) light type effect (as shown in FIG. 1B). In order to increase the light use efficiency, two interactive brightness enhancing films 15, 16 (as (Shown in FIG. 1A) converge the light viewing angle to increase the central angular brightness (as shown in FIG. 1B).

However, the display device 10 needs to be thin, and the conventional display device 10 using the light source module 12 with the micro-miniature LED needs to leave a gap G1 between the light source module 12 and the diffusion sheet 14.

There is also a gap G2 between the second brightness enhancement film 16 and the liquid crystal panel 17, so that there is space for expansion and contraction, which causes the overall thickness to increase. These gaps cause the conventional display device to not meet the requirements for thin devices. Further, although the combined first brightness enhancement film 15 and the second brightness enhancement film 16 can increase the concentration of light, they actually reduce transmittance. Therefore there is need to improve the usable space and interface reflection of the brightness enhancement films 15, 16 of the convention devices, which are inferior.

As shown, there are disadvantages in the prior art that need to be improved.

SUMMARY OF THE INVENTION

In view of the above, the inventor of the present invention has been engaged in the design, manufacturing, and development of related products for many years. After detailed design and careful evaluation of the objectives, the present invention has finally become practical.

An object of the present invention is to provide a light source module for a display device and a manufacturing method thereof, which comprises a method for manufacturing a micro-miniature LED that not only greatly reduces the thickness but also greatly improves the transmittance of the interface reflection efficiency.

The light source module of the display device and the manufacturing method thereof of the present invention mainly comprises the following steps: First, a plurality of light emitting diode chips is arranged in a spaced apart manner on a substrate. A layer of colloid is coated on the light-emitting diode chips with a coating device. The colloid comprises uniformly distributed diffusion particles and fills the gaps between the LEDs. The colloid is rolled with a roller to form a continuous geometric structure on the surface of the colloid. The cross-section of the continuous geometric structure is a cone structure in the horizontal-vertical (XY axis) direction. Finally, an ultraviolet curing device is used on the continuous geometric structure for UV curing of the brightness enhancement layers. In this way, the finished product not only has a greatly reduced thickness and meets the requirements for thin devices, but also has a greatly improved transmittance of the interface reflection efficiency, in order to avoid the many shortcomings of the conventional micro-miniature LEDs.

BRIEF DESCRIPTION OF THE DRAWINGS

To further understand and understand the purpose, shape, structure and function of the present invention, the present invention will be described in detail and illustrated in the drawings as follows:

FIG. 2A is a drawing illustrating a method for manufacturing a light source module of a display device according to an embodiment of the present invention;

FIG. 2B is a drawing illustrating a method for manufacturing a light source module of a display device according to an embodiment of the present invention;

FIG. 2C is a drawing illustrating a method for manufacturing a light source module of a display device according to an embodiment of the present invention;

FIG. 3A is a drawing illustrating another manufacturing method of the light source module of the display device according to an embodiment of the present invention;

FIG. 3B is a drawing illustrating another manufacturing method of the light source module of the display device according to an embodiment of the present invention;

FIG. 3C is a drawing illustrating another manufacturing method of the light source module of the display device according to an embodiment of the present invention;

FIG. 3D is a drawing illustrating another manufacturing method of the light source module of the display device according to an embodiment of the present invention;

FIG. 3E is a drawing illustrating another manufacturing method of the light source module of the display device according to an embodiment of the present invention;

FIG. 5A is a drawing illustrating the appearance of a light source module of a display device according to an embodiment of the present invention;

FIG. 6A is a drawing illustrating another manufacturing method of the light source module of the display device according to an embodiment of the present invention;

FIG. 6B is a drawing illustrating another manufacturing method of the light source module of the display device according to an embodiment of the present invention;

FIG. 6C is a drawing illustrating another manufacturing method of the light source module of the display device according to an embodiment of the present invention;

FIG. 6D is a drawing illustrating another manufacturing method of the light source module of the display device according to an embodiment of the present invention;

FIG. 6E is a drawing illustrating another manufacturing method of the light source module of the display device according to an embodiment of the present invention;

FIG. 6F is a drawing illustrating another manufacturing method of the light source module of the display device according to an embodiment of the present invention;

FIG. 6G is a drawing illustrating another manufacturing method of the light source module of the display device according to an embodiment of the present invention;

FIG. 7A is a drawing illustrating another manufacturing method of the light source module of the display device according to an embodiment of the present invention;

FIG. 7B is a drawing illustrating another manufacturing method of the light source module of the display device according to an embodiment of the present invention;

FIG. 7C is a drawing illustrating another manufacturing method of the light source module of the display device according to an embodiment of the present invention;

FIG. 7D is a drawing illustrating another manufacturing method of the light source module of the display device according to an embodiment of the present invention;

FIG. 7E is a drawing illustrating another manufacturing method of the light source module of the display device according to an embodiment of the present invention;

FIG. 7F is a drawing illustrating another manufacturing method of the light source module of the display device according to an embodiment of the present invention;

FIG. 7G is a drawing illustrating another manufacturing method of the light source module of the display device according to an embodiment of the present invention;

FIG. 7H is a drawing illustrating another manufacturing method of the light source module of the display device according to an embodiment of the present invention;

DESCRIPTION OF THE PREFERRED EMBODIMENTS

Figure 1A:
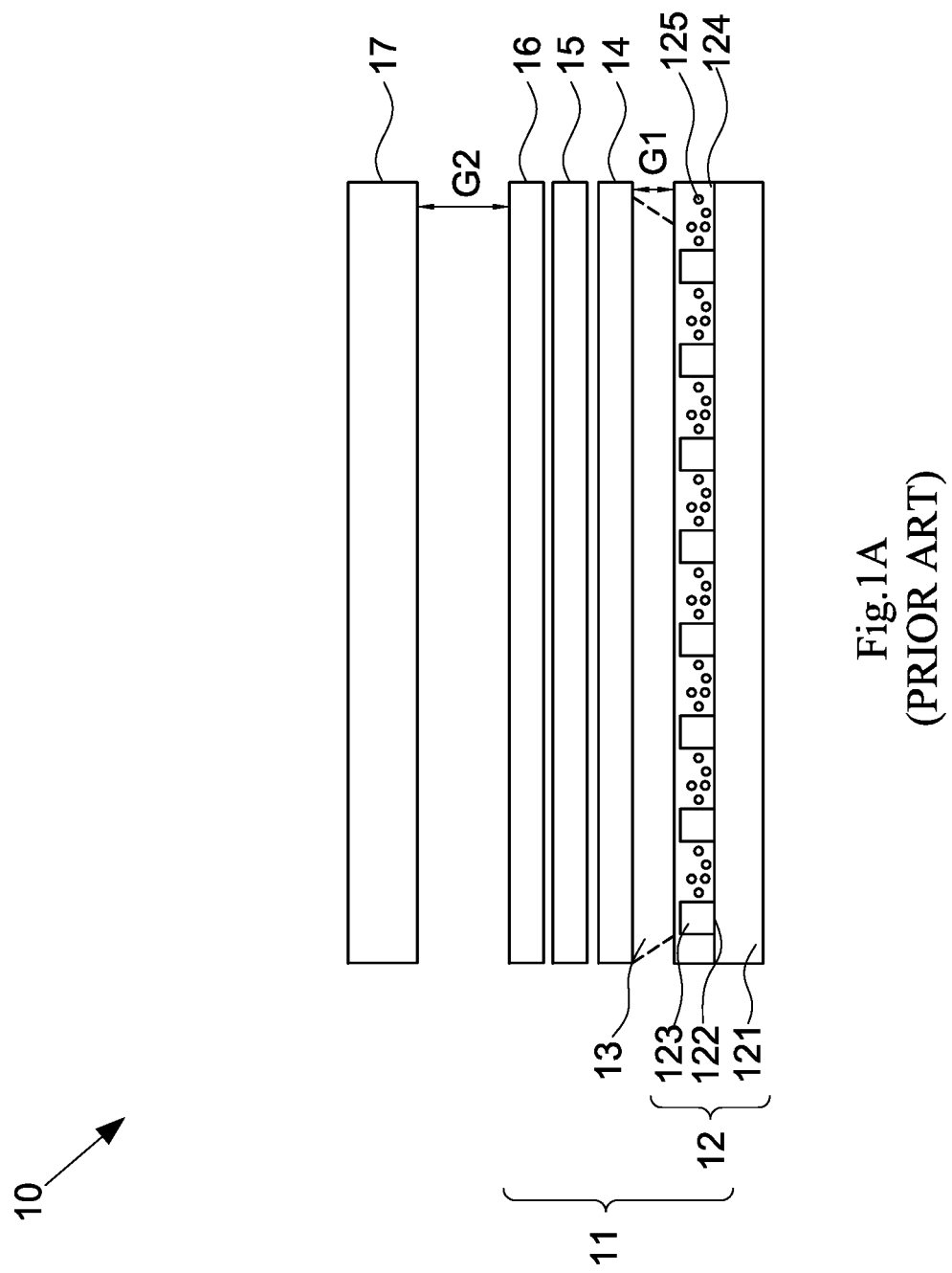
FIG. 1A is a drawing illustrating a chip size package (CSP) and an adhesion process used in current micro-miniature LEDs of the prior art.

The present invention relates to a light source module of a display device and a method for manufacturing the same. Refer to FIGS. 2A, 2B, 2C, 4A, 4B, and 4C for the manufacture of the light source module of the display device of the present invention. The method mainly comprises the following steps:

Step A: First, a plurality of light emitting diode (LED) integrated circuits (ICs), wafers, or chips 31 is arranged on an upper surface of a substrate 32 in a spaced apart arrangement manner.

Step B: A layer of colloid 33 is coated on the light emitting diode chips 31 with a coating device 41. The colloid 33 has uniformly dispersed diffusion particles 334 distributed therein and fills the gaps between the light-emitting diode chips 31.

Step C: Roll the upper surface 331 of the layer of colloid 33 with a roller 42 so that the upper surface 331 of the layer of colloid 33 forms a continuous geometric structure 332. The cross-section of the continuous geometric structure 332 is a tapered cone structure 333 in the horizontal-vertical (XY axis) direction. The top angle of the cone structure is 90 degrees (as shown in FIGS. 4B and 4C).

Step D: Finally, an ultraviolet (UV) curing device 43 is used on the continuous geometric structure 332 on the upper surface of the layer of colloid 33 to perform optical UV curing to create the brightness enhancement layer and form a finished product 30.

Figure 1B:
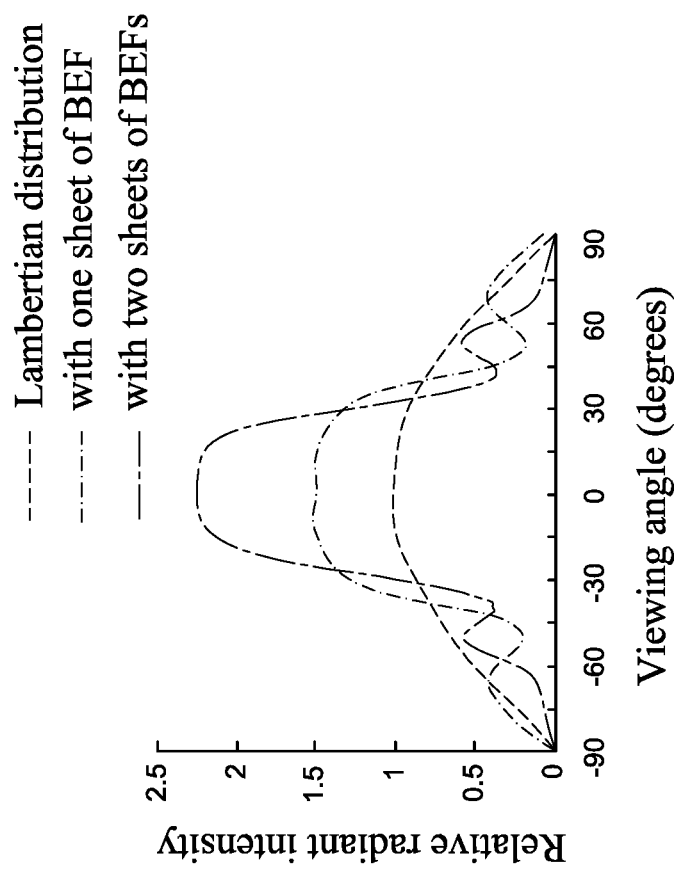
FIG. 1B is a drawing illustrating light properties of current micro-miniature LEDs of the prior art.
Figure 4A:
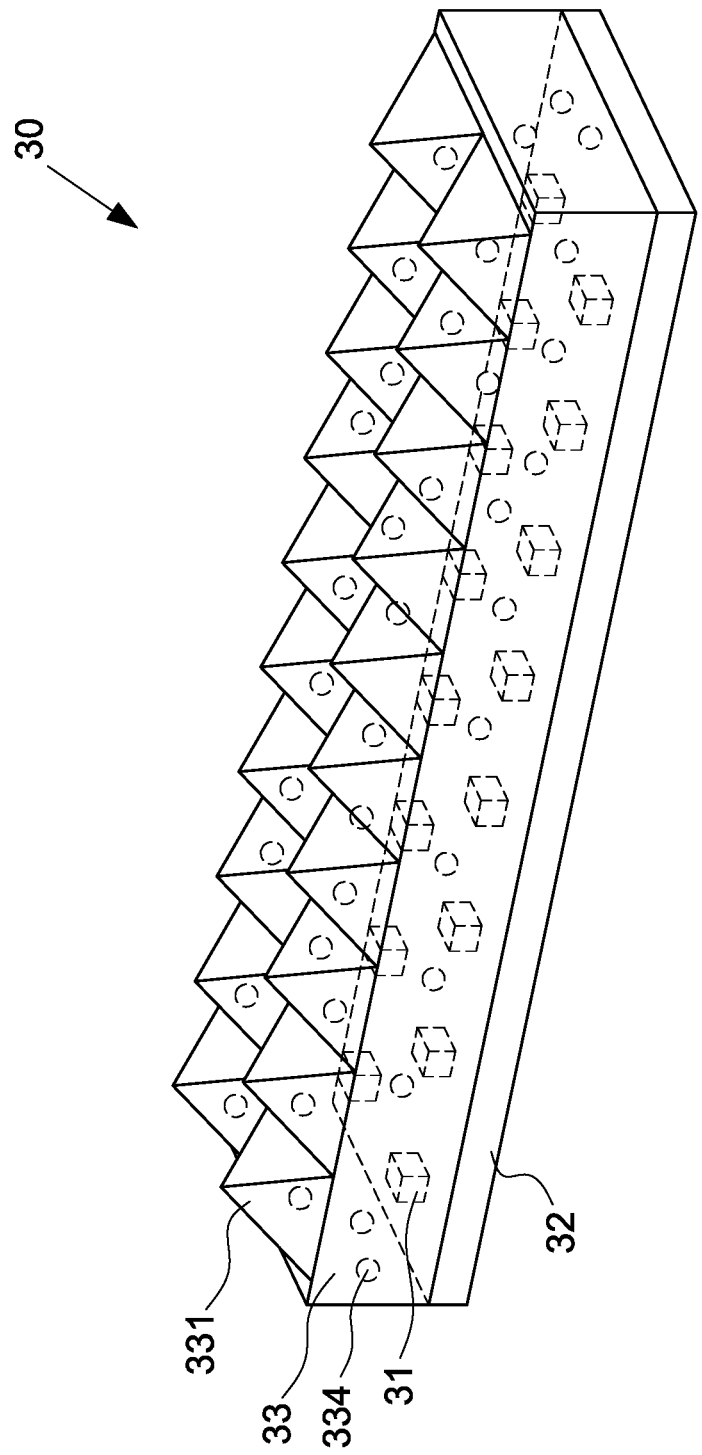
FIG. 4A is a drawing illustrating a finished product of a method for manufacturing a light source module of a display device according to an embodiment of the present invention.
Figure 4B:
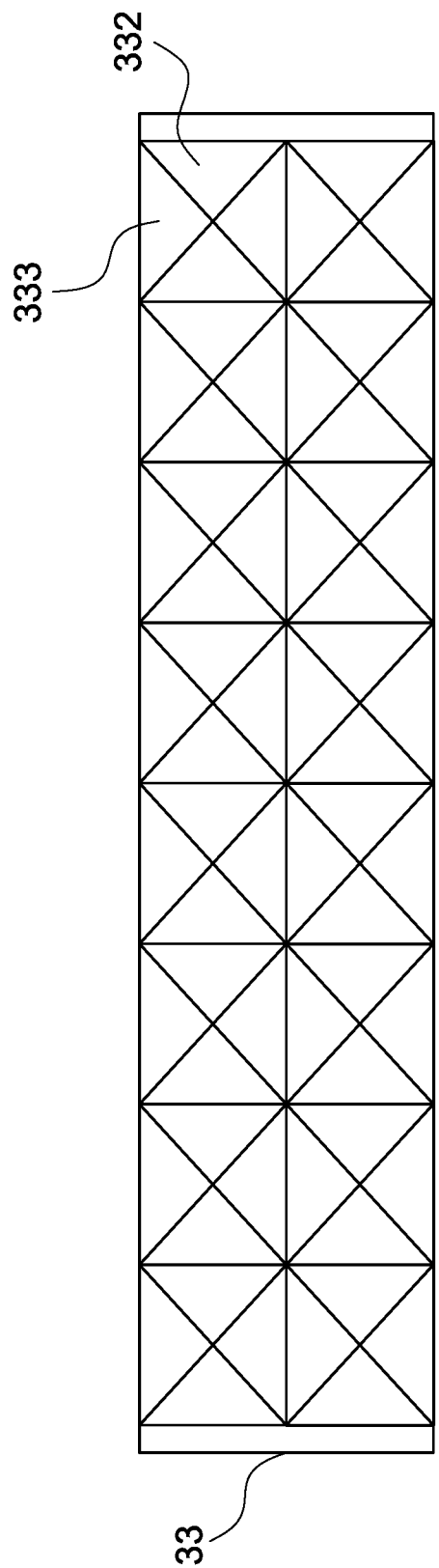
FIG. 4B is a drawing illustrating a finished product of a method for manufacturing a light source module of a display device according to an embodiment of the present invention.
Figure 4C:
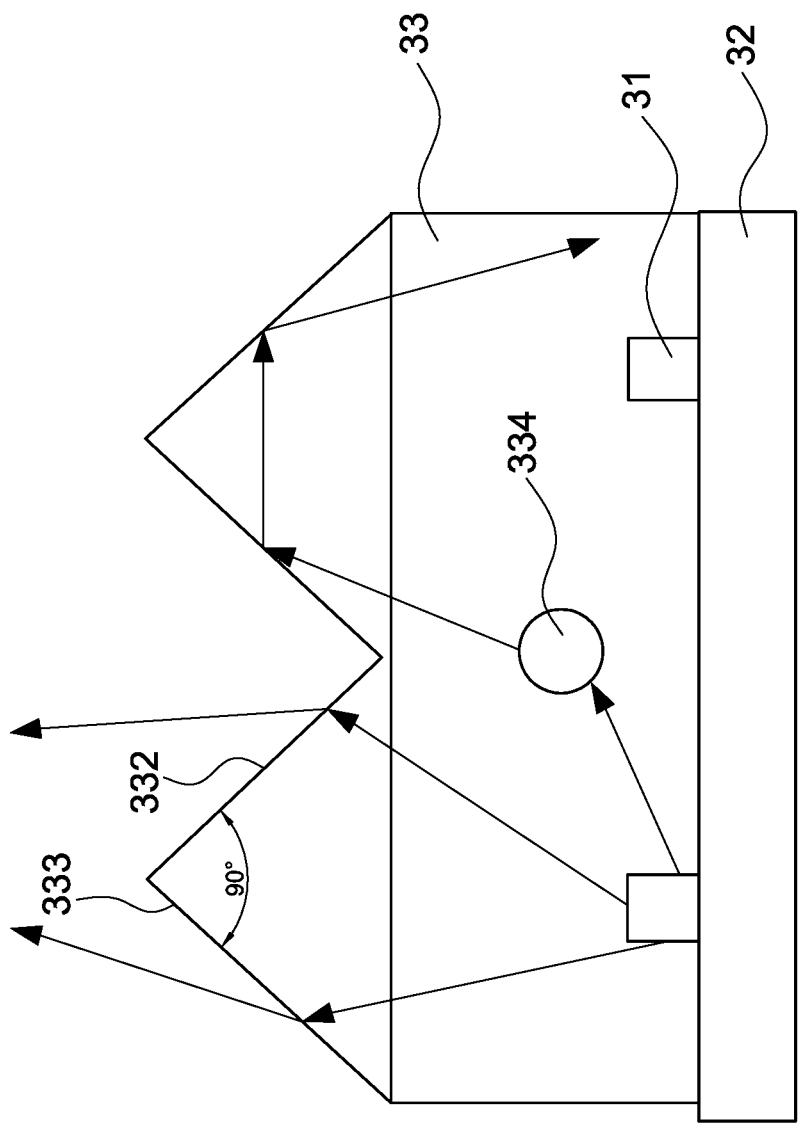
FIG. 4C is a drawing illustrating a finished product of a method for manufacturing a light source module of a display device according to an embodiment of the present invention.

Refer to FIGS. 4A, 4B, and 4C. The finished product 30 uses the layer of colloid 33 with the conical structure 333, whose top angle is 90 degrees, as the brightness enhancement layer which focuses light at a small angle. In this way, the central angular brightness and the light use efficiency are improved. Therefore, the first and second brightness enhancement films 15 and 16 of the conventional micro-miniature LED are not needed, so the gap G1 and the gap G2 are not required to keep the brightness enhancement films 15 and 16 in the correct environment, there is room for expansion and contraction when the temperature changes, and there is no need to improve the use of space and interface reflection of the brightness enhancement films 15 and 16 (as shown in the aforementioned FIGS. 1A and 1B). As a result, the thickness is greatly reduced, which meets the requirements for thin devices. Moreover, the penetration rate of the interface reflection efficiency is also greatly improved, so as to avoid many shortcomings of the aforementioned prior art micro-miniature LEDs.

In an embodiment of the present invention the size of each LED chip 31 is less than 200 microns.

In an embodiment of the present invention the height of the tapered structure 333 is 10 to 300 um.

Refer to FIGS. 3A, 3B, 3C, 3D, 3E, 4A, 4B, and 4C. The light source module of the display device of the present invention and the manufacturing method thereof for another embodiment mainly comprises the following steps:

Step A: First, a plurality of light emitting diode (LED) chips 31 is arranged on an upper surface of a substrate 32 in a spaced apart arrangement manner.

Step B: Use a coating device 41 on the light-emitting diode chips 31 to coat a first adhesive layer 33A. The first adhesive layer 33A is provided with uniformly distributed diffusion particles 334 and fills the gap between the light emitting diode chips 31 evenly.

Step C: Use an ultraviolet curing device 43 on the upper surface of the first adhesive layer 33A to perform optical UV curing.

Step D: Use a coating device 41 to coat a second adhesive layer 34 on the upper surface of the first adhesive layer 33A.

Step E: Roll the upper surface 341 of the second adhesive layer 34 with a roller 42 so that the upper surface 341 of the second adhesive layer 34 forms a continuous geometric structure 332. The cross section of the continuous geometric structure 332 is a cone structure 333 in the (XY axis) direction with a top angle of 90 degrees (as shown in FIG. 4).

Step F: Finally, an ultraviolet curing device 43 is used on the continuous geometric structure 332 on the upper surface of the second adhesive layer 34 for optical UV curing to create the brightness enhancement layer and form a finished product 30.

In this way, the finished product 30 uses the tapered cone structure 333 of the first adhesive layer 33A and the second adhesive layer 34 to concentrate the light at a small angle so that the central angle brightness and the light use efficiency are improved. As a result, the first and second brightness enhancement films 15 and 16 of the prior art are not needed, so the gaps G1 and G2 are not required to allow room for expansion and contraction when the ambient temperature changes. Not only is the thickness greatly reduced, which meets the requirements of thin devices, but also the transmittance of the interface reflection efficiency is greatly improved, so as to avoid many shortcomings of the conventional micro-miniature LEDs.

In an embodiment of the present invention the size of each LED chip 31 is less than 200 microns.

In an embodiment of the present invention the height of the tapered structure 333 is 10-300 um.

Refer to FIG. 5A. The light source module of the display device of the present invention mainly comprises a substrate 62, a display panel 50, and a backlight module 60.

The backlight module 60 is disposed below the corresponding display panel 50. The backlight module 60 has a light source module 61. The light source module 61 is provided with the substrate 62. The substrate 62 has an upper surface 621. The upper surface 621 of the substrate 62 is provided with a plurality of light-emitting diode chips 63 arranged at intervals in a spaced apart manner. The gaps around the light-emitting diode chips 63 are filled with a colloid 64, and the colloid 64 is provided with uniformly distributed diffusion particles 641. The refractive index of these diffusion particles is greater than the refractive index of the colloid 64 to achieve a better diffusion effect. In addition, the upper surface 642 of the colloid 64 has a conical continuous geometric structure 643 in the horizontal-vertical (XY axis) direction (not shown in the figure) which achieves better light-gathering effects.

Figure 5B:
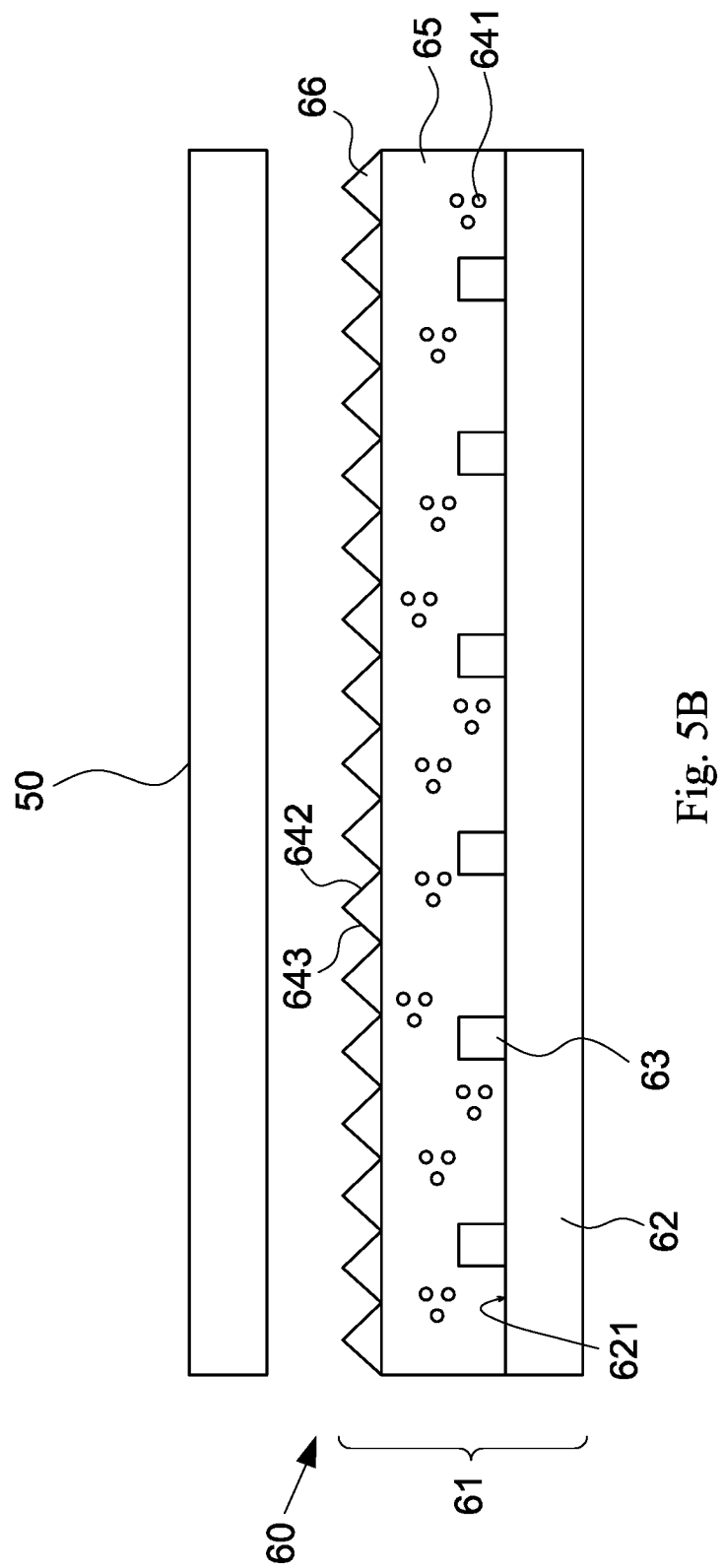
FIG. 5B is a drawing illustrating the appearance of a light source module of a display device according to an embodiment of the present invention.

Refer to FIG. 5B. The light source module of the display device of the present invention mainly comprises a substrate 62, a display panel 50, and a backlight module 60.

The backlight module 60 is disposed below the corresponding display panel 50. The backlight module 60 has a light source module 61. The light source module 61 is provided with the substrate 62. The substrate 62 has an upper surface 621. The upper surface 621 of the substrate 62 is provided with a plurality of light emitting diode chips 63 arranged in spaced apart intervals. The gaps between the light emitting diode chips 63 are filled with a first colloid 65 comprising diffusion particles 641. A second colloid 66 is provided on the first colloid 65. The upper surface 642 of the second colloid 66 has a continuous geometric structure 643. The cross-section of the continuous geometric structure 643 is a conical structure in the horizontal-vertical (XY axis) direction.

Figure 5C:
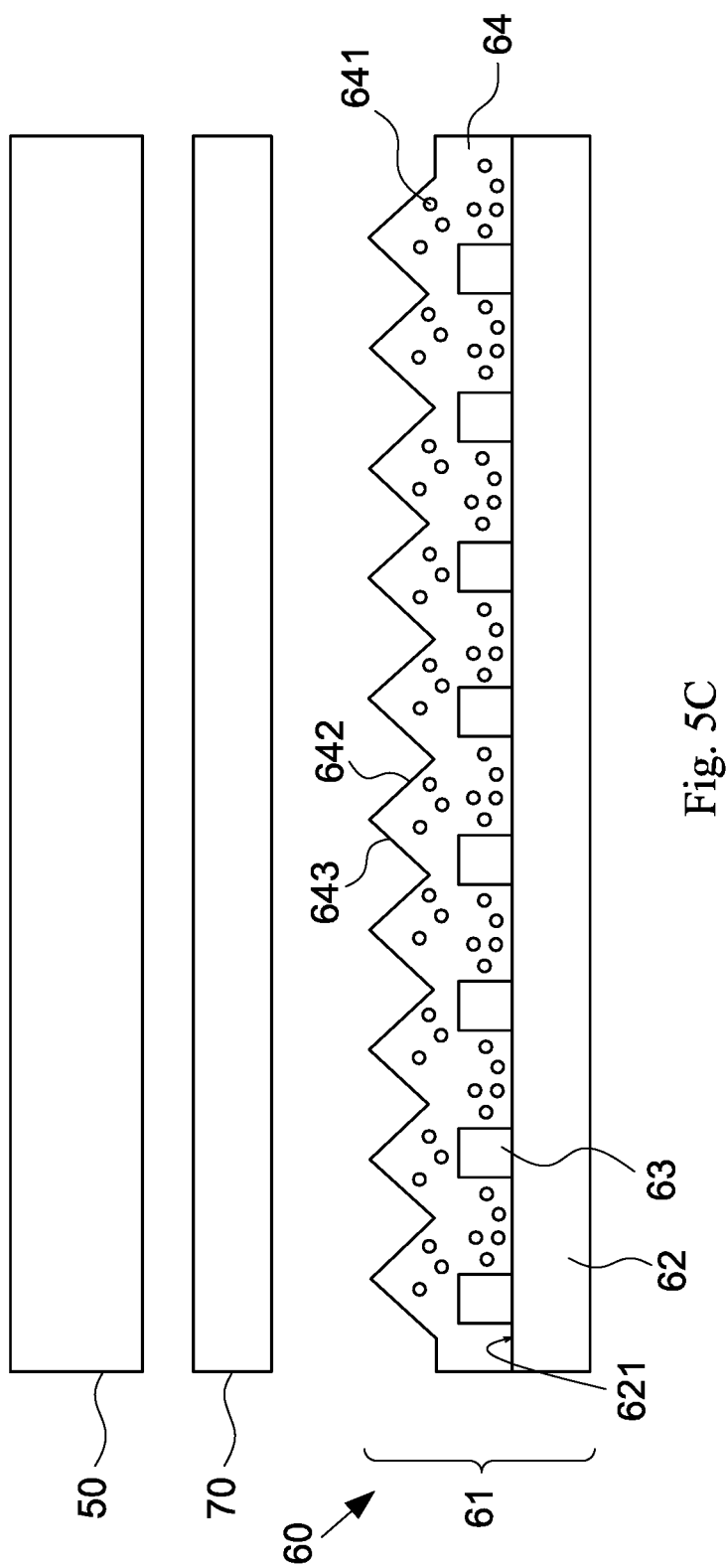
FIG. 5C is a drawing illustrating the appearance of a light source module of a display device according to an embodiment of the present invention.
Figure 5D:
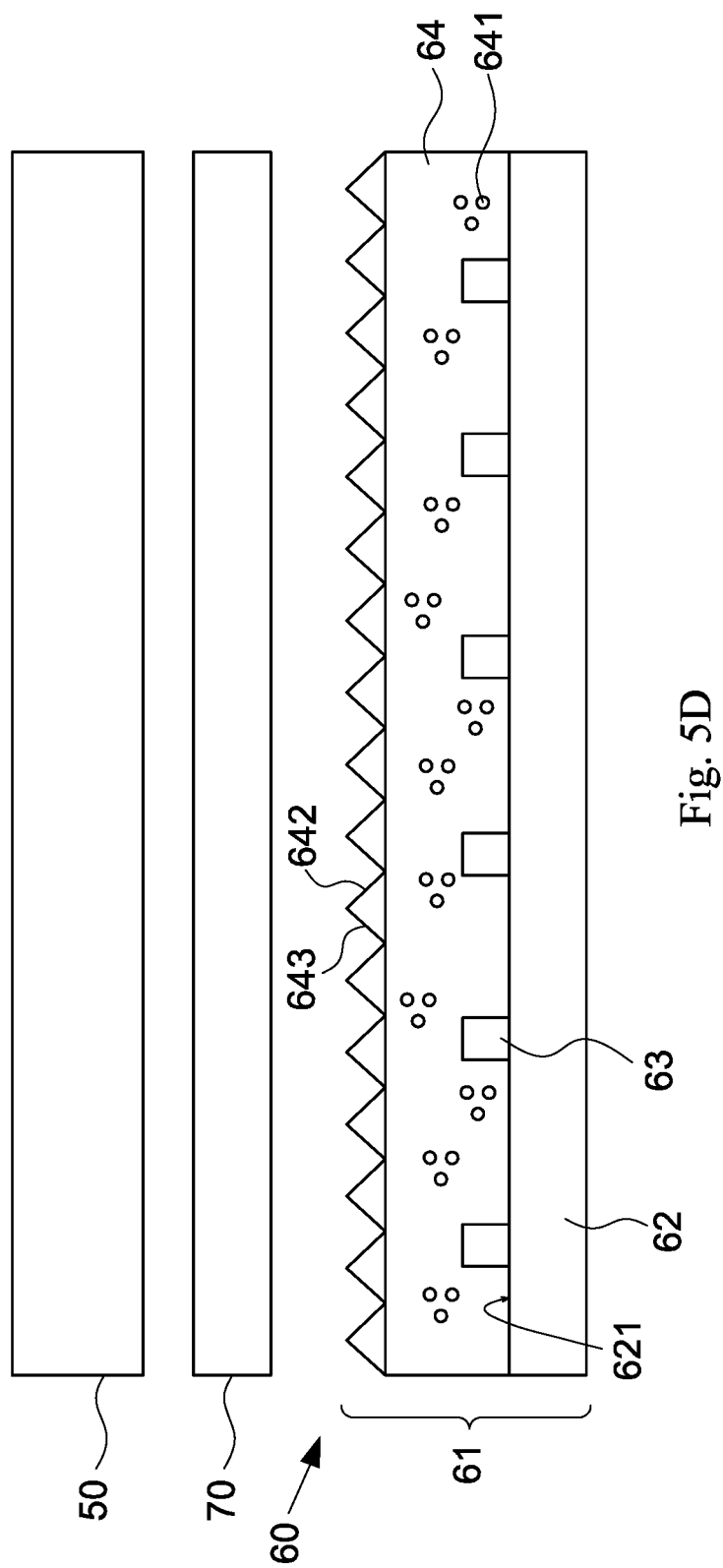
FIG. 5D is a drawing illustrating the appearance of a light source module of a display device according to an embodiment of the present invention.

Refer to FIGS. 5C and 5D. In an embodiment a diffusion sheet 70 is further provided between the display panel 50 and the backlight module 60. The diffusion sheet 70 is located above the light source module 61 to support the light-emitting area of the light source module 61.

Refer to FIGS. 6A, 6B, 6C, 6D, 6E, 6F, and 6G. The light source module of the display device of the present invention and the manufacturing method thereof in another embodiment mainly comprises the following steps:

Step A: First, a plurality of light emitting diode (LED) chips 31 is arranged on the upper surface of a substrate 32 in a spaced apart arrangement.

Step B: A first adhesive layer 81 is coated on the light-emitting diode chips 31 with a coating device 41, and the first adhesive layer 81 has uniformly distributed diffusion particles 82 dispersed therein. The first adhesive layer 81 fills the gaps between the light emitting diode chips 31.

Step C: Roll the upper surface 811 of the first adhesive layer 81 with a roller 42, so that the upper surface 811 forms a continuous geometric structure 811a. The cross-section of the continuous geometric structure 811a is arranged in a triangular structure manner and the continuous geometric structure 811a extends in one direction. Step D: Use an ultraviolet curing device 43 to perform optical UV curing on the continuous geometric structure 811a, so that the first adhesive layer 81 forms a first prism layer 81a, wherein the refraction index $n_2$ of the first adhesive layer diffusion particles 82 is greater than the refractive index $n_1$ of the first prism layer 81a (that is, $n_2 > n_1$).

Step E: Use a coating device 41 to apply a second adhesive layer 83 on the continuous geometric structure 811a of the first adhesive layer 81. The refractive index $n_3$ of the second adhesive layer 83 is smaller than the first refractive index $n_1$ of the first prism layer 81a (that is, $n_3 < n_1$).

Step F: A third adhesive layer 84 is coated on the second adhesive layer 83 again by a coating device 41. Third adhesive layer diffusion particles 85 are uniformly distributed in the third adhesive layer 84.

Step G: Roll the upper surface 841 of the third adhesive layer 84 with a roller 42, so that the upper surface 841 forms a continuous geometric structure 841a. The cross-section of the continuous geometric structure 841a is arranged in a triangular structure. The extending direction of the continuous geometric structure 841a of the third adhesive layer 84 and the extending direction of the continuous geometric structure 811a of the first adhesive layer 81 are substantially perpendicular.

Step H: Use a UV curing device 43 on the continuous geometric structure 841a of the third adhesive layer 84 to perform optical UV curing and create brightness enhancement layers, so that the third adhesive layer 84 forms a second prism layer 84a, The refractive index $n_5$ of the third adhesive layer diffusion particle 85 is greater than the refractive index $n_4$ of the second prism layer 84a (ie, $n_5 > n_4$), and the refractive index $n_3$ of the second adhesive layer 83 is smaller than the refractive index n4 of the second prism layer 84a (that is, n3<n4). This forms a finished product 80.

Refer to FIGS. 7A, 7B, 7C, 7D, 7E, 7F, 7G, and 7H, the light source module of the display device of the present invention and the manufacturing method thereof in another embodiment mainly comprises the following steps:

Step A: First, a plurality of light emitting diode (LED) chips 31 is arranged on an upper surface of a substrate 32 in a spaced apart arrangement.

Step B: Use a coating device 41 to coat a first adhesive layer 81 on the light emitting diode chips 31 and fill the gaps around the light emitting diode chips 31. The first adhesive layer 81 is uniformly distributed with first adhesive layer diffusion particles 82.

Step C: Roll the upper surface 811 of the first adhesive layer 81 using a roller 42 to form a continuous geometric structure 811a on the upper surface 811. The cross-section of the continuous geometric structure 811a is arranged in a triangular structure. The continuous geometric structure 811a extends in one direction.

Step D: Use an ultraviolet curing device 43 to perform optical UV curing on the continuous geometric structure 811a, so that the first adhesive layer 81 forms a first prism layer 81a. Wherein the refractive index n2 of the first adhesive layer diffusion particles 82 is greater than the refractive index n1 of the first prism layer 81a (that is, n2>n1).

Step E: Use a coating device 41 to apply a second adhesive layer 83 on the continuous geometric structure 811a of the first adhesive layer 81. The refractive index n3 of the second adhesive layer 83 is smaller than the refractive index n1 of the first prism layer 81a (that is, n3<n1).

Step F: A third adhesive layer 84 is coated on the second adhesive layer 83 again by a coating device 41, and uniform third adhesive layer diffusion particles 85 are distributed in the third adhesive layer 84.

Step G: Roll the upper surface 841 of the third adhesive layer 84 using a roller 42, so that the upper surface 841 forms a continuous geometric structure 841a. The cross-section of the continuous geometric structure 841a is arranged in a triangular structure. Wherein, the continuous geometric structure 841a extends in another direction, and the extending direction of the continuous geometric structure 841a of the third adhesive layer 84 and the extending direction of the continuous geometric structure 811a of the first adhesive layer 81 are substantially perpendicular to each other.

Step H: Use an ultraviolet curing device 43 on the upper surface 841 of the third adhesive layer 84 to perform optical UV curing to create the brightness enhancement layers, so that the third adhesive layer 84 forms a second prism layer 84a. The refractive index n5 of the third adhesive layer diffusion particles 85 is larger than the refractive index n4 of the second prism layer 84a (that is, n5>n4). The refractive index n3 of the second adhesive layer 83 is smaller than the refractive index n4 of the second prism layer 84a (that is, n3<n4).

Step I: Apply a fourth adhesive layer 86 on the third adhesive layer 84 again using a coating device 41 to form a diffusion layer, so that the thickness of the fourth adhesive layer is greater than or equal to the thickness of the second prism layer 84a. This method can eliminate the arrangement of the diffusion sheet, save costs, and can decrease thickness. In this way, a finished product 80a is formed.

In an embodiment of the present invention, in step I, a flat layer is formed on the second prism layer 84a and a diffusion layer (not shown in the figure) is attached to form a finished product 80a.

Figure 8:
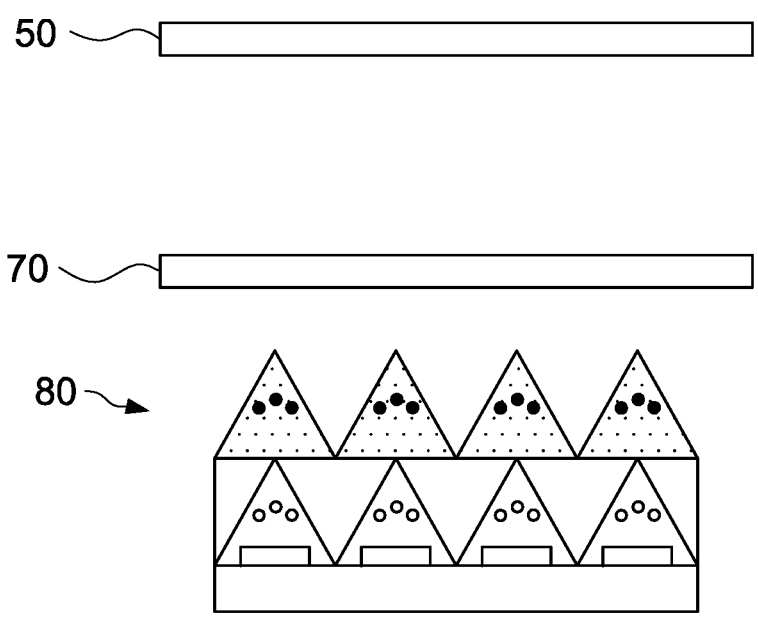
FIG. 8 is a drawing illustrating using a light source module with diffusion sheet of a display device according to an embodiment of the present invention.

Refer to FIG. 8. In an embodiment the finished product 80 does not have a diffusion sheet function, so a diffusion sheet 70 needs to be provided. The display panel 50 is disposed above the diffusion sheet 70 so that the diffusion sheet 70 supports the light emitting area of the light emitting diode chips 31.

Figure 9:
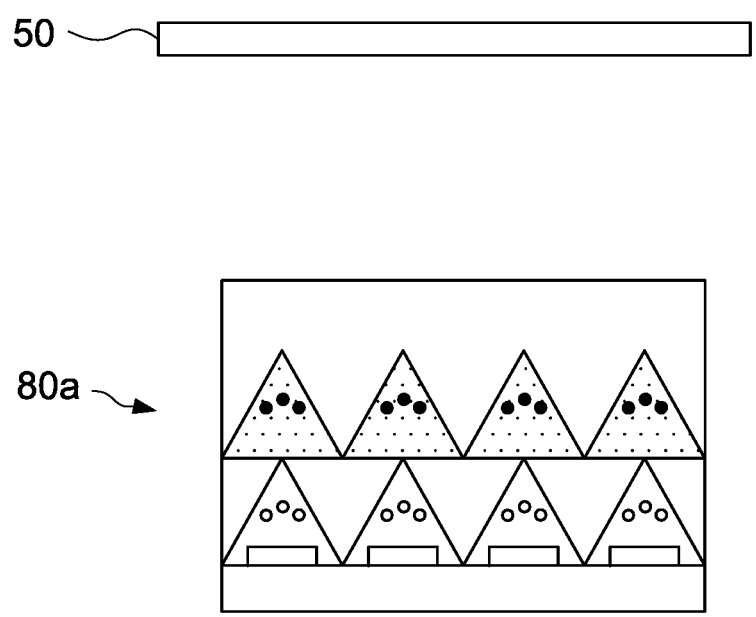
FIG. 9 is a drawing illustrating using a light source module with diffusion sheet of a display device according to an embodiment of the present invention.

As shown in FIG. 9, the finished product 80a has a diffusion layer, so the display panel 50 is provided directly above it, which can reduce the arrangement of the diffusion sheet, save costs, and decrease thickness.

The above description comprises the best embodiments of the present invention, but the structural features of the present invention are not limited thereto, and any change or modification that can be easily considered by those skilled in the art can be covered.

What is claimed is:

1. A method for manufacturing a light source module of a display device comprising:
    arranging a plurality of light emitting diode chips on an upper surface of a substrate in a spaced apart manner;
    applying a colloid on the light emitting diode chips with a coating device, the colloid comprising uniformly distributed diffusion particles dispersed therein, and the colloid filling gaps between the light emitting diode chips;
    rolling the colloid with a roller to form a continuous geometric structure on the colloid, and a cross-section of the continuous geometric structure comprises a tapered structure in a horizontal-vertical (X-Y axis) direction; and
    optically curing the continuous geometric structure to form a brightness enhancement layer;
    wherein the colloid comprises a first adhesive layer, a second adhesive layer, and a third adhesive layer, and the first adhesive layer and the third adhesive layer are rolled by the roller to form continuous geometric structures, thereby creating a first prism layer and a second prism layer respectively.

2. The method for manufacturing a light source module of a display device of claim 1, wherein the size of each light-emitting diode chip is less than 200 microns.

3. The method for manufacturing a light source module of a display device of claim 1, wherein a top angle of the tapered structure is 90 degrees.

4. The method for manufacturing a light source module of a display device of claim 1, wherein height of the tapered structure is 10~300 um.

5. The method for manufacturing a light source module of a display device of claim 1, wherein the first adhesive layer and the third adhesive layer comprise uniformly distributed diffusion particles.

6. The method for manufacturing a light source module of a display device of claim 5, wherein a refractive index of the first adhesive layer diffusion particles is greater than a refractive index of the first prism layer, a refractive index of the second adhesive layer is smaller than the refractive index of the first prism layer, a refractive index of the third adhesive layer diffusion particles is greater than a refractive index of the second prism layer, and the refractive index of the second adhesive layer is smaller than the refractive index of the second prism layer.

7. The method for manufacturing a light source module of a display device of claim 1, wherein a continuous geometric structure of the first adhesive layer and a continuous geometric structure of the third adhesive layer extend in different directions and are substantially perpendicular to each other.

8. A method for manufacturing a light source module of a display device comprising:
   arranging a plurality of light emitting diode chips on an upper surface of a substrate in a spaced apart manner;
   applying a colloid on the light emitting diode chips with a coating device, the colloid comprising uniformly distributed diffusion particles dispersed therein, and the colloid filling gaps between the light emitting diode chips;
   rolling the colloid with a roller to form a continuous geometric structure on the colloid, and a cross-section of the continuous geometric structure comprises a tapered structure in a horizontal-vertical (X-Y axis) direction; and
   optically curing the continuous geometric structure to form a brightness enhancement layer;
   wherein the colloid comprises a first adhesive layer, a second adhesive layer, a third adhesive layer, and a fourth adhesive layer, and the first adhesive layer and the third adhesive layer are rolled by the roller to form continuous geometric structures, thereby creating a first prism layer and a second prism layer.

9. The method for manufacturing a light source module of a display device of claim 8, wherein the size of each light-emitting diode chip is less than 200 microns.

10. The method for manufacturing a light source module of a display device of claim 8, wherein a top angle of the tapered structure is 90 degrees.

11. The method for manufacturing a light source module of a display device of claim 8, wherein height of the tapered structure is 10~300 um.

12. The method for manufacturing a light source module of a display device of claim 8, wherein thickness of the fourth adhesive layer is greater than or equal to the thickness of the second prism layer.

13. The method for manufacturing a light source module of a display device of claim 8, wherein the first adhesive layer and the third adhesive layer comprise uniformly distributed diffusion particles.

14. The method for manufacturing a light source module of a display device of claim 13, wherein a refractive index of the first adhesive layer diffusion particles is greater than a refractive index of the first prism layer, a refractive index of the second adhesive layer is smaller than the refractive index of the first prism layer, a refractive index of the third adhesive layer diffusion particles is greater than a refractive index of the second prism layer, and the refractive index of the second adhesive layer is smaller than the refractive index of the second prism layer.

15. The method for manufacturing a light source module of a display device of claim 8, wherein a continuous geometric structure of the first adhesive layer and a continuous geometric structure of the third adhesive layer extend in different directions and are substantially perpendicular to each other.

* * * * *